United States Patent [19]

Trumble et al.

[11] Patent Number: 5,545,494
[45] Date of Patent: Aug. 13, 1996

[54] ENVIRONMENTAL PROTECTORS FOR ELECTRONICS DEVICES

[75] Inventors: William P. Trumble, Kanata; Mark R. Harris, Woodlawn; Adrianus P. Van Gaal, Kanata, all of Canada

[73] Assignee: Northern Telecom Limited, Montreal, Canada

[21] Appl. No.: 513,735

[22] Filed: Aug. 10, 1995

[51] Int. Cl.⁶ .................................................. H01M 2/02
[52] U.S. Cl. .................. 429/163; 429/176; 206/524.2; 206/701; 428/35.8
[58] Field of Search .................................. 429/176, 163, 429/153, 159; 428/35.3, 35.8, 35.9; 206/328, 333, 524.2, 524.3; 220/415, 903

[56] References Cited

U.S. PATENT DOCUMENTS

| | | | |
|---|---|---|---|
| 4,288,843 | 9/1981 | Schroeder | 429/176 X |
| 4,664,994 | 5/1987 | Koike et al. | 429/163 |
| 4,874,656 | 10/1989 | Rantanen. | |
| 5,097,949 | 3/1992 | Heldwein | 206/524.2 X |
| 5,436,058 | 7/1995 | Kato et al. | 220/415 X |

*Primary Examiner*—Anthony Skapars
*Attorney, Agent, or Firm*—R. J. Austin

[57] ABSTRACT

An environmental protector for electronics devices in outside terminal boxes. The protector has a laminate wall which provides a moisture barrier, penetration resistant surface and EMI shield. The protector may be flexible or substantially rigid and is in the form of an open-ended container for receiving an electronics device. The container is sealed at the open end around a connector unit of the device with outgoing terminals accessible for connection purposes. The device may be potted within the container. Conveniently, the EMI shield is connected to ground by a ground element in the connector unit.

25 Claims, 4 Drawing Sheets

ENVIRONMENTAL PROTECTORS FOR ELECTRONICS DEVICES

This invention relates to environmental protectors for electronics devices and is primarily concerned with protectors for protection of devices used in the telecommunications industry.

In the telecommunications industry, outside telecommunications cables coming into customers' premises have terminations within terminal boxes at which location the outside cables are connected to the customers' inside circuitry. This has more recently been performed by the use of at least one printed circuit board within a box and the use of surface mount components upon the board. Particularly where terminal boxes are located on the outside walls of buildings or in humid areas within buildings, this recent development had led to moisture problems which affect the performance of and cause deterioration in the electronic equipment. There are also electromagnetic interference problems which are created by electromagnetic emissions either from such equipment or being received by the equipment. These problems need to be solved or minimized in the most economical fashion so as not to noticeably affect the cost of the equipment and/or the telecommunications use charges to a customer.

According to one aspect of the present invention there is provided an environmental protector for an electronics device comprising a container having a laminate wall to provide a moisture barrier, a penetration resistant outer surface, and a shield to electromagnetic radiation, the container provided to house an electronic device and having an opening for insertion of the device with the opening shaped so as to fit around and be sealed around a peripheral surface of an electrical connector unit mounted upon the device whereby the protector and connector unit together form an enclosure for the device.

Thus, the protector is formed so as to fit around the device and with the protector sealed against the peripheral surface of the connector unit, the connector terminals for connection to other devices or equipment exteriorly of the protector, face outwardly from the protector.

The protector may comprise a flexible container or the container may be substantially rigid. Preferably, the laminate wall comprises at least one outer layer of particularly robust and cut and burst resistant material. Such a material is polyethyleneterephthalate, an example of which is sold under the trade name "Mylar". The thickness of this layer as with other layers in the laminate wall is dependent upon whether the container is flexible or is substantially rigid and may be between 0.5 and 1 mil. To provide electromagnetic shielding, the laminate wall should also include a layer of EMI shield material which should be an electrically conductive metal, for instance copper, aluminum, steel or silver. This metal layer preferably has a thickness between 0.2 and 1 mil for a flexible container and up to 3 mil in thickness for a substantially rigid container. The EMI shield layer may lie adjacent to the outer robust layer. The EMI shield layer provides also tactile strength and thermal sag resistance to the structure and is preferably non-perforate so as to provide a fluid barrier. Particularly however, where the container is substantially rigid, it may be preferred for a layer of rigidifying material such as a paper composite, plastic, plastic foam, or a metal screen material to be interposed between the EMI shield layer and the robust outer layer.

Inwardly of the EMI shield layer there is preferably disposed a further layer or layers which provide further moisture or gas proof protection. The or each of these layers may be from 0.2 to 2.6 mil in thickness, for example, and may be made from materials based on polyvinyl chloride, polyvinylidene chloride or polyvinyl dichloride which are bonded to the EMI shield layer.

The layers of the container are preferably laminated together using a moisture proof electromagnetic shield resistant adhesive or another film laminate called an ionomer such as Surlyn that will adhere to the metal face plate with applied heat.

Accordingly to one arrangement of the above invention, it is also possible to pot the electronic device within the container by using polymer elastomers such as silicon, urethane or flexible polyesters to protect the components from mechanical damage and from moisture intrusion. The potting compound should be a low durometer material with a Shore 0 hardness up to, but preferably not exceeding, 50. The potting compound may be inserted into the container between the container and the connector, before the container is secured in place to the connector, so as to occupy the otherwise free space within the container. It is also preferable that the potting compound should be curable at room temperatures or at low temperatures such that no damage will result to the electronic device, the connector or to the container itself.

The invention also includes in combination, an electronic device, an electrical connector unit with conductors extending from a first to a second group of terminals and with the first terminals connected to conductors of the device, and an environmental protector comprising a container comprising a laminate wall to provide a moisture barrier, a penetration resistant outer surface, and a shield to electromagnetic radiation, the device housed within the container which is provided with an opening for insertion of the device, the connector unit disposed within the opening with the material of the container defining the opening sealed around a peripheral surface of the connector unit, whereby the container unit together with the connector form an enclosure for the device and the second group of terminals face outwardly away from the container.

The invention also includes a method of containerizing an electronic device in which the device comprises an electrical connector having conductors extending from a first to a second group of terminals with the first group of terminals connected to conductors of the device, the method comprising: providing an environmental protector comprising a container having a laminate wall to provide a moisture barrier, a penetration resistant outer surface, and a shield to electromagnetic radiation; inserting the device through an opening in the container and into the container; and with the opening in the container being of a shape such as to enable the material of the container defining the opening to be sealingly joined to and around a peripheral surface of the connector unit, sealing the material around the opening to the peripheral surface of the connector unit whereby the container together with the connector unit forms an enclosure for the device and the second group of terminals face outwardly away from the container.

Embodiments of the invention will now be described, by way of example, with reference to the accompanying drawings, in which.

Figure 1:
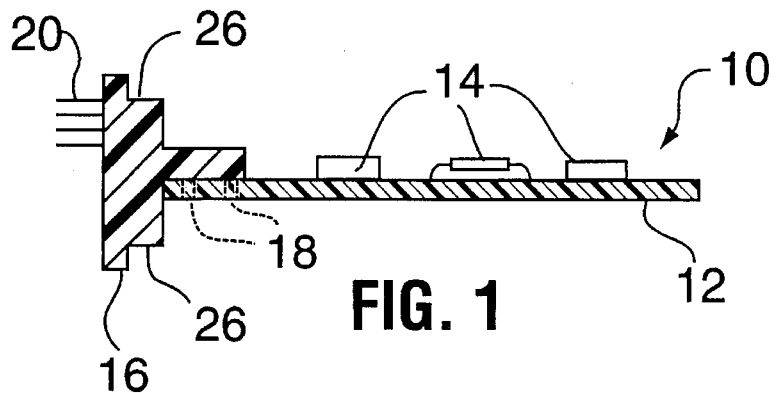
FIG. 1 is a cross-sectional view through an electronic device comprising a printed circuit board having a connector unit mounted at one end.

In a first embodiment as shown in FIG. 1, an electronic device 10 is provided which is to be installed in an outside terminal box and requires protection from ambient moisture effects which may cause degradation to the device or deleteriously affect its usage. The device 10 comprises a printed circuit board 12 upon which are mounted a plurality of electronic components 14 such as capacitors and resistors. At one end of the board 12 there is provided a connector unit comprising an end connector 16 which has a first group of signal and ground terminals 18 (dotted outlines) extending into the circuitry of the board. The connector 16 also has a second group of signal and ground terminals 20 facing outwardly from an end surface of the connector and in a direction away from the board.

Figure 2:
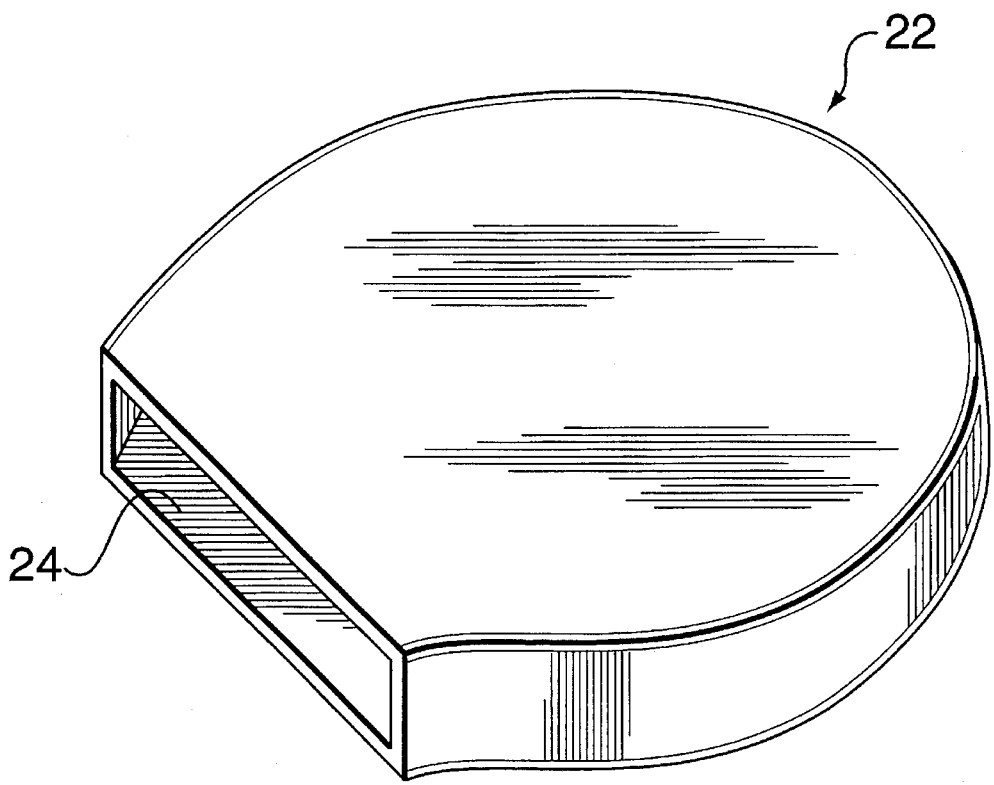
FIG. 2 is an isometric view of an environmental protector according to a first embodiment.
Figure 3:
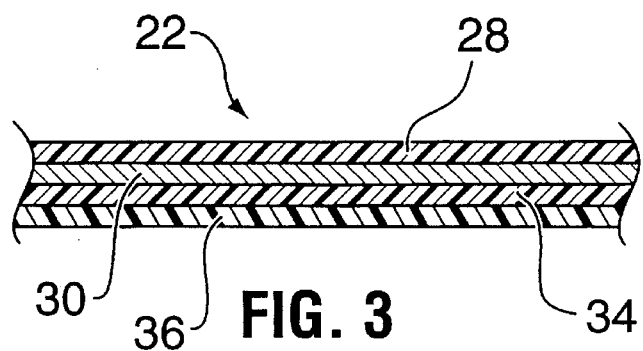
FIG. 3 is an enlarged cross-sectional view through a laminate wall of the protector of the first embodiment.

In FIG. 2 and according to a first embodiment, there is shown an environmental protector 22 for protecting the electronic device 10. The protector 22 is a flexible container or bag having an opening 24 suitable for closely surrounding a peripheral surface 26 (FIG. 1) of the connector 16 so as to be capable of being sealed against this surface. As shown by FIG. 3, the container 22 has a flexible laminate wall with an outer robust cut and abrasion resistant layer 28 formed from polyethylene terephthalate from 0.5 to 1 mil in thickness. This particular material may be that sold under the trade name "Mylar". Other plastic film materials may also be suitable for this purpose. Inwardly of the layer 28 is a second layer 30 which serves as an electromagnetic shield for the electronic device 10. This layer 30 is therefore composed of an electrical conductive material, i.e. aluminum up to 1 mil in thickness, but alternatively other materials such as copper, steel or silver may be suitable. For the purpose of also serving as a moisture or other fluid barrier into the bag, the layer 30 should also be imperforate. Inwardly of the layer 30 is a third layer 34. This layer is substantially moisture impermeable and preferably is formed from a plastic film such as polyvinylidene chloride (such as sold under the trade name "Saran") although other materials such as polyvinyl chloride are suitable. This third layer is from between 0.3 to 2.6 mil in thickness.

The container 22 is formed from a laminate sheet material cut and shaped into the bag with ends overlapped or abutted together and sealed with an electromagnetic shielding heat seal adhesive.

The laminate wall of the container 22 is completed with an innermost layer 36 of a film of an ionomer, i.e. ethylene acrylic acid copolymer salt such as sold under the trade name "Surlyn". This material is used for the innermost layer as it is heat sealable against the metal of the connector 16 for the purpose of sealing the bag into position. It is simply necessary for the ethylene acrylic acid copolymer salt to exist merely around the innermost surface at the intermediate vicinity of the aperture 24, but for convenience, it is applied to the whole of the layer 34 of the container by the laminating process.

Figure 4:
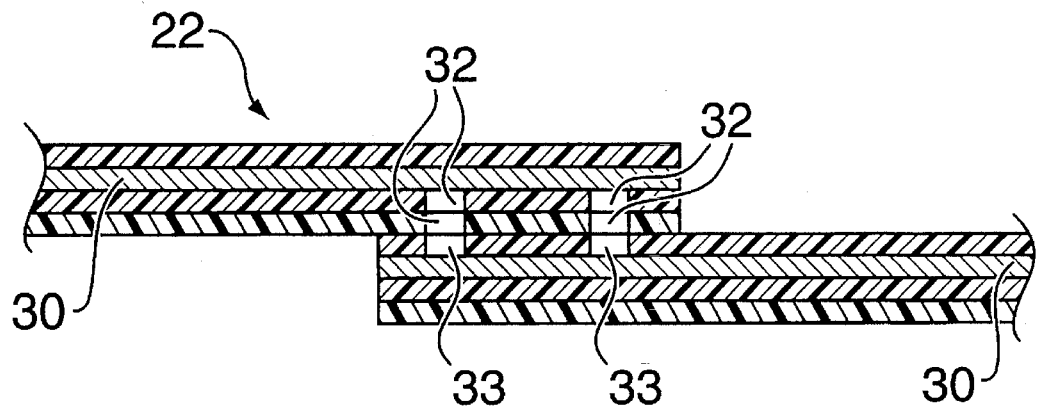
FIG. 4 is an enlarged cross-sectional view through the laminate wall and in a different position.

As shown by FIG. 4, at the overlaps, the sheet material is formed from one side and at one edge with holes 32 and at the other side at the other edge with holes 33. These holes extend to the aluminum layer 30 and are axially aligned so as to provide ohmic connection between the aluminum at the two ends and provide complete electromagnetic Shielding for the electronic device 10.

In an alternative arrangement to the first embodiment, instead of employing the holes 32 and 33, the aluminum layer 30 at one of the overlapped ends is provided with pressed-out pointed metal spurs 35. These are pressed through the plastic layers of the other end (FIG. 5) to provide a direct mechanical connection between the two ends of the aluminum layer to complete the electromagnetic shielding.

The completed bag is applied around the electronic component (FIG. 4) by passing the component 10 through the opening 24 into the bag and with the material of the opening surrounding the surface 26 of the connector. By applying suitable heat treatment, the innermost layer 36 is then heat sealed into position upon the surface 26. As a result of this the container 22 and the connector 16 form a composite enclosure for the device 10 to minimize moisture access to the device. In addition, electromagnetic radiation is substantially prevented through the bag so as substantially not to affect the performance of the device 10 or other electronic devices exterior of the container 22.

Figure 7:
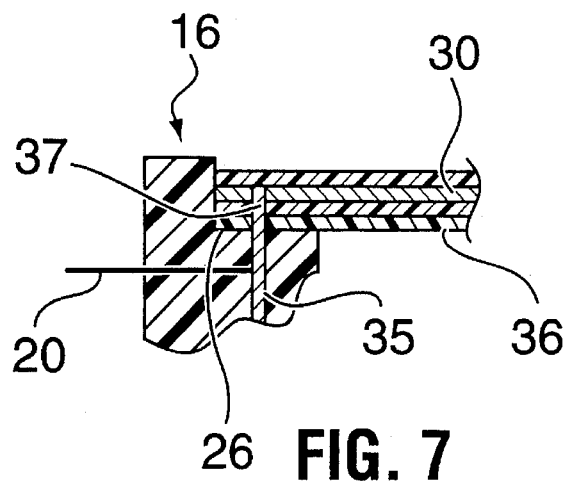
FIG. 7 is a cross-sectional view of part of the assembly and to a larger scale to show more detail.

As shown by FIG. 7, the body of the connector 16 is molded around a metal ground plate 35 which is connected to ground, in use through a ground terminal 20. The ground plate 35 has metal spurs 37 projecting from the peripheral surface 26 of the connector. The spurs 37 are caused to project through the inner layers 34 and 36 of the protector 22 and into electrical contact with the aluminum layer 30 so as to ground the electromagnetic radiation shield.

As may be seen from the above embodiment, the container 22 is of simple construction and is extremely effective in protecting the electronic device 10 from outside environmental conditions and also provides effective shielding together with the connector 16. As may be seen, the terminals 20 of the connector may still be connected to an incoming cable to the device 10 without any interference with the seal between the container and the connector. In addition the container is extremely inexpensive in manufacture while offering extremely good mechanical protection (for instance as offered by the outside layer 28) and also without applying stress to the components of the electronic device.

Figure 8:
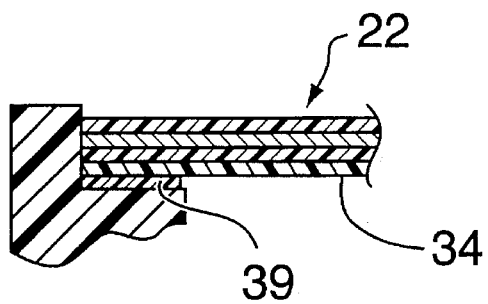
FIG. 8 is a view similar to FIG. 7 and showing a modification to the first embodiment.

In a modification of the first embodiment (FIG. 8), the container 22 is not sealed directly by the layer 36 to the surface 26 of the connector, but an electromagnetic shield adhesive 39 is used instead for this purpose. In this case the innermost layer 36 may be omitted from the laminate structure.

In a further modification (not shown), the outer layer 28 may be of perforated, knitted, or woven construction to aid in thermal emission of heat from the board should heat generation prove to be a problem.

Figure 5:
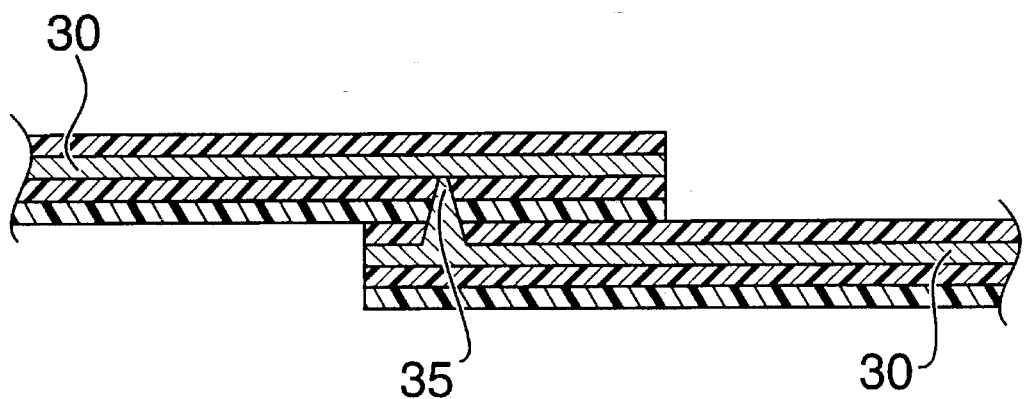
FIG. 5 is a view similar to FIG. 4 of an alternative structure.
Figure 6:
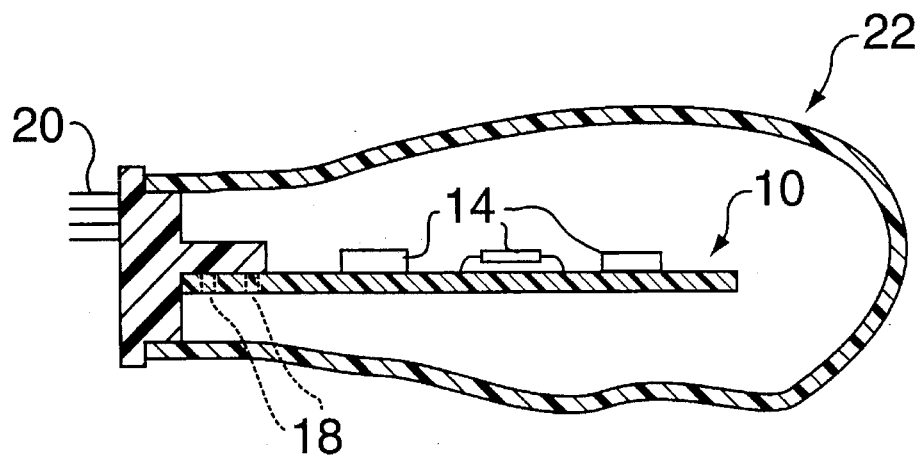
FIG. 6 is a view similar to FIG. 1 and showing the protector of the first embodiment assembled to the electronic device.
Figure 9:
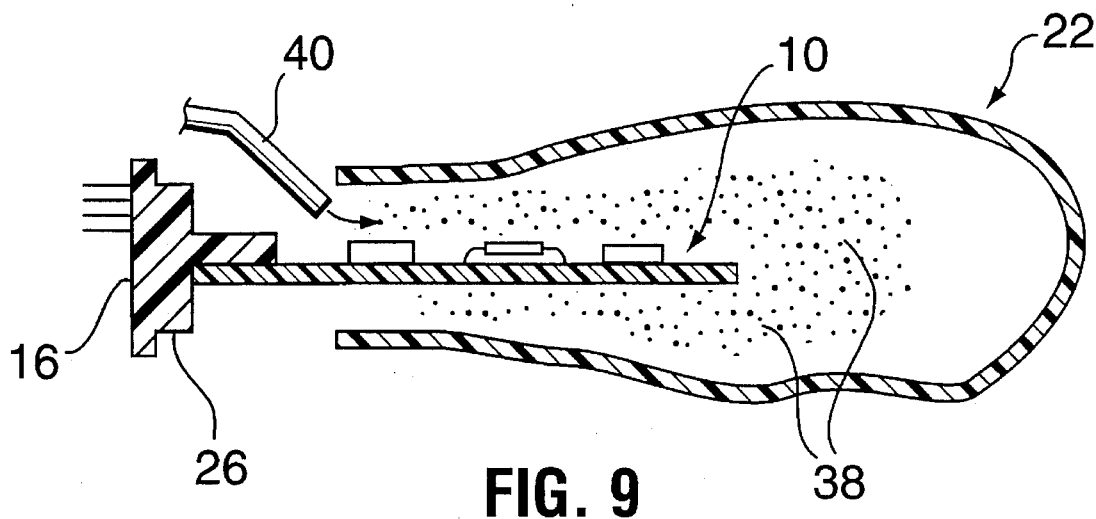
FIG. 9 is a view similar to FIG. 6 and showing one stage during the assembly of the protector of the first embodiment onto the electronic device and according to a different arrangement.

In a different arrangement of the first embodiment as shown in FIG. 9, it is the intention that the electronic device 10 is to be potted within the container 22 within a room temperature curable polymeric elastomer such as silicon, urethane, or a flexible polyester to protect the components of the device from mechanical damage and also from moisture intrusion. The potting compound needs to be of extremely low durometer number such as a Shore O hardness of no greater than 50. As indicated by FIG. 5, to apply the potting material, the electronic device 10 is inserted into the container 22 and with the connector 16 spaced from the lip of the aperture 24 to provide an opening, the potting material 38 is pressurized through a nozzle 40 inserted into the gap to pass it into the volumetric space within the container. Upon completion of this step, the container is sealed into position around the connector 16 as described in the first embodiment and the potting compound is cured in position.

Figure 10:
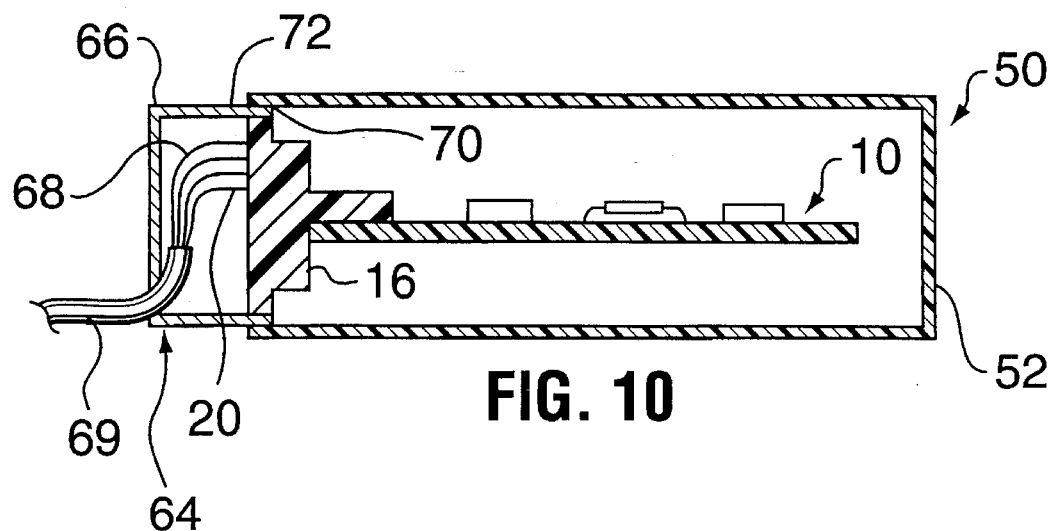
FIG. 10 is a view similar to FIG. 6 of an environmental protector according to a second embodiment mounted upon the electronic device.
Figure 11:
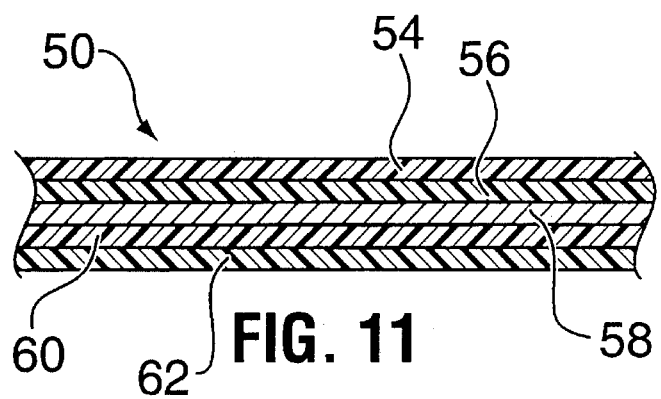
FIG. 11 is an enlarged cross-sectional view of a laminate wall of the protector of the second embodiment.

In a second embodiment as shown in FIG. 10, an environmental container 50 is of more rigid construction than is described in the first embodiment and takes the shape of a straight-sided box having a flat end 52. This box 50 is also of laminate construction (FIG. 11) and has an outer layer 54 of polyethylene terephthalate or other flexible polyester up to 2 mil in thickness. Directly inwardly of the layer 54 is disposed a rigidifying layer 56 for the box and which provides a substantially rigidifying effect to the construction. This layer 56 is formed either from a stiff paper composite material, a plastics material of suitable thickness to provide the required rigidity or a plastic foam to produce a similar result. Alternatively, the layer 56 is a metal screen also of suitable thickness to provide sufficient rigidity. Inner layers 58 and 60 are formed respectively from an electromagnetic interference shield material, e.g. aluminum as in the first embodiment, and a gas and moisture proof film up to 2 mil in thickness such as polyvinylidene chloride or polyvinyl chloride also as described in the first embodiment. These materials on this thicker construction may have a maximum thickness for layer 58 of 3 mil and of layer 60 of up to 2 mil. An innermost layer 62 of the box 54 is again formed for "Surlyn" as in the first embodiment.

The box 50 may be adhesively sealed against a surface 26 of the connector 16, or an alternative arrangement may be provided as shown in this present embodiment. As shown in this embodiment, the connector 16 forms part of a connector unit 64 in which a housing 66 extends around the periphery of the connector 16 and is secured to the periphery. This housing 66 defines an inner chamber which houses ends of conductor wires 68 extending to the group 20 of terminals, the wires extending in substantially sealed relationship (as a cable 69) through an aperture 68 in the housing. The dimensions of the box 50 and the housing 66 are such that an open end 70 of the box slidably fits around a flange 72 of the housing and is either heat sealed thereto or is sealed to the housing by use of a moisture proof EMI resistant adhesive.

In the second embodiment, the electromagnetic interference shield layer 58 is connected to ground by a ground plate molded into the connector and spurs extending from the ground plate to the layer 58 in a manner similar to that of FIG. 7 in the first embodiment.

The structure of the second embodiment shown in FIG. 10 may be modified with the addition of a potting material as described with reference to FIG. 9. This potting compound may include suitable heat transfer particulate material to facilitate heat transfer from the device 10 to the wall of the box 50 so as to control the operational temperature of the electronic device.

Figure 12:
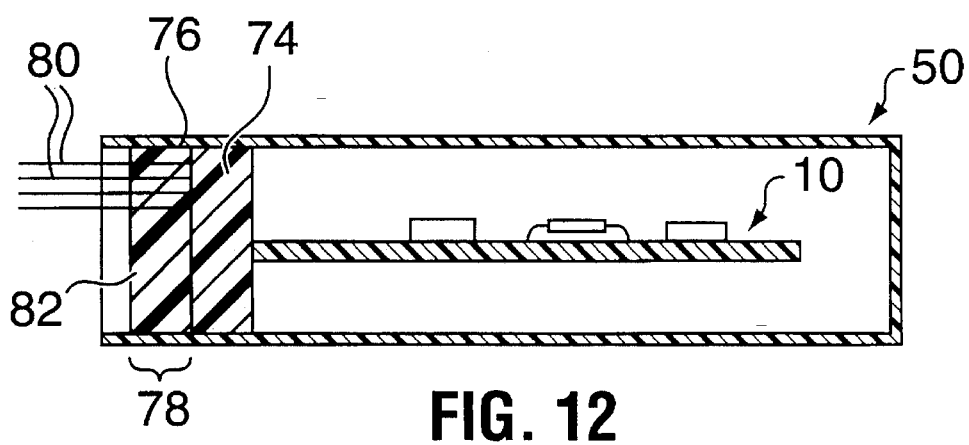
FIG. 12 is a view similar to FIG. 6 of an environmental protector and electronic device according to a third embodiment.

In a third embodiment (FIG. 12), an electronic device 10 has an end connector 74 with an unstepped peripheral surface 76. The connector 74 is inserted completely into an environmental protector 50 upon insertion of the device 10 into the protector so that an end region 78 of the protector extends out beyond the connector. The connector is connected to the metal shield layer of the protector by spurs and a ground plane molded into the connector in a manner similar to that described with reference to FIG. 7 in the first embodiment.

With the signal and ground terminals 80 extending from the connector, out through the end of the protector, the connector is potted by potting compound 82 which may be the same materials used for potting with regard to FIG. 9. Hence, the connector and the device 10 are both protected from the outside environment.

The structure of the second and third embodiments have similar advantages to those described above.

What is claimed is:

1. An environmental protector comprising a container comprising a laminate wall to provide a moisture barrier, a penetration resistant outer surface, and a shield to electromagnetic radiation, the container provided to house an electronic device and having an opening for insertion of the device into the container with the opening shaped so as to fit around and be sealed around a peripheral surface of an electrical connector unit mounted upon the device whereby the protector and connector unit together form an enclosure for the device.

2. A protector according to claim 1 wherein the laminate wall comprises a first and outer layer of polyethyleneterephthalate.

3. A protector according to claim 2 wherein the laminate wall also includes a second layer inwardly of the outer layer, the second layer forming an electromagnetic radiation shield of flexible electrically conductive metal.

4. A protector according to claim 3 wherein the container has an innermost layer formed from a heat sealable material.

5. A protector according to claim 4 wherein the heat sealable material is an ionomer.

6. A protector according to claim 3 wherein the second layer has a maximum thickness of 3 mil.

7. A protector according to claim 6 wherein the second layer is imperforate.

8. A protector according to claim 3 wherein the laminate wall includes a third layer inwardly of the second layer, the third layer comprising a substantially moisture impermeable material.

9. A protector according to claim 3 wherein the layers of the wall are laminated together using an electromagnetic radiation shield adhesive.

10. A protector according to claim 2 wherein the container is flexible.

11. A protector according to claim 10 provided with a second layer inwardly of the outer layer, the second layer forming an electromagnetic radiation shield of flexible electrically conductive metal up to a maximum thickness of 1 mil.

12. A protector according to claim 11 including a third layer inwardly of the second layer, the third layer comprising a substantially moisture impermeable material having a thickness up to 2.6 mil.

13. A protector according to claim 12 having an innermost layer of ethylene acrylic acid copolymer salt.

14. A protector according to claim 2 wherein the container is substantially rigid.

15. A protector according to claim 14 wherein the laminate wall includes a layer of rigidifying material.

16. A protector according to claim 15 wherein the layer of rigidifying material lies directly beneath the first and outer layer.

17. A protector according to claim 1 wherein the electromagnetic radiation shield comprises at least one layer of electrically conductive material of the laminate wall, and the protector is formed from laminate sheet material shaped to make the container with edge regions of the sheet material overlapping, and the overlapped edge regions are both formed with holes into the laminate wall the holes extending to the layer of electrically conductive material, and the holes are axially aligned from edge region to edge region to provide ohmic connection between the electrically conductive material at the two edge regions.

18. A protector according to claim 1 wherein the electromagnetic radiation shield comprises at least one layer of electrically conductive material of the laminate wall, and the protector is formed from laminate sheet material shaped to make the container with edge regions of the sheet material overlapping and electrically conductive spurs extend outwardly from the electrically conductive material in one edge region and through laminate walls of the edge regions to lie in conductive contact with the electrically conductive material in the other edge region.

19. In combination, an electronic device, an electrical connector unit mounted upon the device and having a first and second groups of terminals with the first terminals connected to conductors of the electronic device, and an environmental protector comprising a container comprising a laminate wall to provide a moisture barrier, a penetration resistant outer surface, and a shield to electromagnetic radiation, the electronic device housed within the container which is provided with an opening for the insertion of the device, the connector unit disposed within the opening with the material of the container defining the opening being sealed around a peripheral surface of the connector unit whereby the container together with the connector form an enclosure for the device and the second group of terminals face outwardly away from the closure.

20. A combination according to claim 19 wherein the connector unit comprises an electrical connector and the material of the container defining the opening is sealed around a peripheral surface of the connector whereby the container together with the connector form the enclosure.

21. A combination according to claim 19 wherein the connector unit comprises an electrical connector and a housing secured to the connector and housing end portions of electrical wires extending from the second group of terminals, the wires extending from their end portions through an aperture in the housing, and the material of the container is sealed around a peripheral surface of the housing to provide the enclosure.

22. A combination according to claim 20 wherein the container extends outwardly away from the device beyond the connector.

23. A combination according to claim 19 wherein the connector unit comprises an electrical connector and the material of the container defining the opening extends outwardly from the device beyond the connector, and the connector also includes a mass of potting material which has hardened in position sealed within the material of the container defining the opening.

24. A combination according to claim 19 wherein the electromagnetic radiation shield is connected to a ground plate provided within the connector, conductive spurs extending from the ground plate through the laminate wall to the electromagnetic radiation shield.

25. A method of containerizing an electronic device in which an electrical connector unit is mounted upon the device and has conductors extending from a first to a second group of terminals and has the first group of terminals connected to connectors of the device, the method comprising:

providing an environmental protector comprising a container having a laminate wall to provide a moisture barrier, a penetration resistant outer surface, and a shield to electromagnetic radiation;

inserting the electronic device through an opening in the container and into the container;

and with the opening in the container being of a shape such as to enable the material of the container defining the opening to be sealingly joined to and around a peripheral surface of the connector unit, sealing the material around the opening to the peripheral surface of the connector unit whereby the container together with the connector unit forms an enclosure for the electronic device and the second group of terminals face outwardly away from the container.

* * * * *